(12) United States Patent
Otaki et al.

(10) Patent No.: US 7,018,744 B2
(45) Date of Patent: Mar. 28, 2006

(54) VOLUME TYPE HOLOGRAM RECORDING PHOTOSENSITIVE COMPOSITION, VOLUME TYPE HOLOGRAM RECORDING MEDIUM USING THE SAME AND METHOD OF PRODUCING VOLUME TYPE HOLOGRAM

(75) Inventors: Hiroyuki Otaki, Tokyo (JP); Toshio Yoshihara, Tokyo (JP)

(73) Assignee: Dai Nippon Printing Co, LTD, Tokyo-To (JP)

( * ) Notice: Subject to any disclaimer, the term of this patent is extended or adjusted under 35 U.S.C. 154(b) by 236 days.

(21) Appl. No.: 10/228,676

(22) Filed: Aug. 27, 2002

(65) Prior Publication Data

US 2003/0087163 A1    May 8, 2003

(30) Foreign Application Priority Data

Aug. 27, 2001  (JP)  ............................. 2001-256485

(51) Int. Cl.
 *G03H 1/04*  (2006.01)
(52) U.S. Cl. ................. 430/1; 430/2; 430/281.1; 430/330; 359/3.3
(58) Field of Classification Search .............. 430/2, 430/1, 281.1, 230; 359/3
See application file for complete search history.

(56) References Cited

U.S. PATENT DOCUMENTS

| | | | | |
|---|---|---|---|---|
| 5,229,252 A | * | 7/1993 | Flynn et al. | 430/280.1 |
| 5,282,066 A | * | 1/1994 | Yu et al. | 359/3 |
| 5,512,607 A | * | 4/1996 | Kinashi et al. | 522/100 |
| 6,045,953 A | * | 4/2000 | Ohe et al. | 430/1 |
| 6,218,074 B1 | * | 4/2001 | Dueber et al. | 430/273.1 |
| 6,593,058 B1 | * | 7/2003 | Feiring et al. | 430/270.1 |
| 2002/0110740 A1 | * | 8/2002 | Otaki et al. | 430/1 |
| 2003/0044690 A1 | * | 3/2003 | Rotto | 430/1 |

FOREIGN PATENT DOCUMENTS

| | | | |
|---|---|---|---|
| EP | 945762 | * | 9/1999 |
| JP | 05-323850 | * | 12/1993 |
| JP | 11-161139 | * | 6/1999 |
| JP | 2000-122515 | * | 4/2000 |
| JP | 2000-137210 | * | 5/2000 |

* cited by examiner

*Primary Examiner*—Martin Angebranndt
(74) *Attorney, Agent, or Firm*—Timothy J Keefer; Seyfarth Shaw LLP

(57) ABSTRACT

The present invention provides a volume type hologram recording photosensitive composition. A type (i) composition comprises one or more photopolymerizable compounds, a heat-curable compound and a heat-curing crosslinking agent, wherein the heat-curing crosslinking agent is a latent heat-curing crosslinking agent which is not reacted in an interference exposure process, is not reacted at the heating temperature used in a refractive index-modulation promoting process and becomes active at the heating temperature used in a heat-curing process. A type (ii) composition further comprises a binder resin beside the type (i) volume type composition.

12 Claims, No Drawings

VOLUME TYPE HOLOGRAM RECORDING PHOTOSENSITIVE COMPOSITION, VOLUME TYPE HOLOGRAM RECORDING MEDIUM USING THE SAME AND METHOD OF PRODUCING VOLUME TYPE HOLOGRAM

BACKGROUND OF THE INVENTION

1. Field of the Invention

The present invention relates to a novel photosensitive composition capable of recording a volume type hologram and a volume type hologram recording photosensitive medium produced using the same, and, particularly to a novel photosensitive composition which can be used for graphic arts (GA), security cards, optical elements (HOE) such as color filters, reflecting plates for display, head-up displays or the like and data storage system, and a volume type hologram recording photosensitive medium produced using the same.

2. Description of the Related Art

A system in which as to the three-dimensional information of an object, refractive index modulation is caused inside of a recording layer by an object light (a reflected light from the object) and reference light to record an interference fringe has been known as a volume type hologram. In recent years, a volume type hologram recording photosensitive composition of a dry developing type which does not require wet developing treatment in the production of a volume type hologram and can mass-produce the hologram has attracted considerable attention.

As such a volume type hologram recording photosensitive composition, only an Omnidex series (trademark) available from Du Pont is mass-produced and put on the market. This material uses a radical polymerizable compound, a binder resin, a photo-radical polymerization initiator and a sensitizing dye as its major components and makes use of a difference in refractive index between the radical polymerizable compound and the binder resin. Specifically, when the photosensitive resin composition formed as a film or layer is exposed to interferential light, radical polymerization is initiated at bright regions which are irradiated with more intense light. Along with the polymerization, a gradient of concentration of the radical polymerizable compound is produced, which causes the radical polymerizable compound to diffuse and move from dark regions which are irradiated with weak light to the bright regions. As a consequence, a difference in the concentration of the radical polymerizable compound is caused corresponding to the light intensities of the interference light and appears as a difference in refractive index. This material system has the best performance among volume type hologram photopolymers which have been reported so far and the amount Δn of modulation of the refractive index of this system which amount is calculated based on the Kogelnik theory reaches a maximum of about 0.06. However, the Omnidex series (trademark, available from Du Pont) has the problem that it is weak to heat and is colored and is therefore limited in applications to optical materials.

Also, a material system for a volume type hologram which uses a combination of radical polymerization and cationic polymerization is reported. For example, a system using a compound having a diallylfluorene skeleton as a high-refractive index radical polymerizable compound and a cationic polymerizable compound having a lower refractive index than the radical polymerizable compound is disclosed in JP Patent No. 2873126. In this system, high-refractive index components are polymerized by radical polymerization during hologram exposure and the radical polymerizable compound is diffused and moved to the regions irradiated with light. Then, the image is subjected to fixing exposure to fix it by cationic polymerization, whereby a difference in refractive index is formed according to the distribution of composition and an interference fringe is formed.

Also, a material system for a volume type hologram which utilizes cationic polymerization is disclosed in, for example, U.S. Pat. No. 5,759,721. This material system has the advantage of being free from such oxygen inhibition as seen in a radical polymerization system. However, this system has the problem that it has low photosensitivity to cationic polymerization and also, it is difficult to make this system have sensitivity in a long-wavelength range.

Also, an organic-inorganic hybrid material system for a volume type hologram which uses a combination of an inorganic material network and a photopolymerizable compound is disclosed in JP Patent No. 2953200. This system has the problem that, because an organic polymer is present in a rigid inorganic network, a hologram recording medium is excessively hardened, so that it is difficult to roll it, exhibiting poor processing adaptability and the time required to form a coating layer is made prolonged.

Also, in Japanese Patent Application National Publication No. 2000-508783, a material obtained by dispersing metal ultra-fine particles in a solid matrix is disclosed as a hologram recording material. However, in this material, it is required to make the matrix have fluidity, giving rise to the problem concerning processing adaptability.

Also, a hologram recording material comprising a heat-curable epoxy oligomer, a radical polymerizable aliphatic compound, a photo initiator generating radical species, a photo initiator for activating cationic polymerization and a sensitizing dye is disclosed as a volume type hologram material system having excellent heat resistance in the publication of JP Patent No. 3075081. However, unsatisfactory Δn is obtained in the volume type hologram described in this publication.

SUMMARY OF THE INVENTION

It is an object of the present invention to provide a volume type hologram recording photosensitive composition which can attain a high Δn capable of exhibiting excellent optical characteristics and exhibits high heat resistance and also to provide a volume type hologram recording photosensitive medium and a method of producing a volume type hologram with the use of such a composition.

The above object can be attained by a volume type hologram recording photosensitive composition according to the present invention. The composition is a type (i) volume type hologram recording photosensitive composition comprising one or more photopolymerizable compounds, a heat-curable compound and a heat-curing crosslinking agent, wherein the heat-curing crosslinking agent is a latent heat-curing crosslinking agent which is not reacted in an interference exposure process, is not reacted at the heating temperature used in a refractive index-modulation promoting process and becomes active at the heating temperature used in a heat-curing process.

A volume type hologram recording photosensitive composition of another aspect according to the present invention is a type (ii) volume type hologram recording photosensitive composition further comprising a binder resin beside the type (i) volume type hologram recording photosensitive composition. Specifically, the type (ii) composition comprises one or more photopolymerizable compounds, a heat-curable compound, a heat-curing crosslinking agent and a binder resin, wherein the heat-curing crosslinking agent is a latent heat-curing crosslinking agent which is not reacted in an interference exposure process, is not reacted at the heating temperature used in a refractive index modulation promoting process and becomes active at the heating temperature used in a heat-curing process.

The latent heat-curing crosslinking agent used in the volume type hologram recording photosensitive composition of the present invention becomes active under a specific heating condition to promote the curing of the heat-curable compound. This latent heat-curing crosslinking agent is one which is reacted neither in the interference exposure process nor in the heating process performed for the purpose of promoting the modulation of refractive index, and serves to cure a coating layer of a type (i) or type (ii) volume type hologram recording photosensitive composition when heated at temperatures higher than that in the above each process, specifically at a temperature at which the blocked positions are broken, in the heat-curing process for performing final heating.

A heat-curing system in the present invention uses the latent heat-curing crosslinking agent, and such a latent heat-curing crosslinking agent is not reacted in heating process with the purposes of the interference exposure process and the refractive index modulation promoting process, and therefore the heat-curing system does not inhibit exhibition of hologram performances thereby providing the volume type hologram excellent in heat resistance without degradation of the hologram performances.

A method of producing a volume type hologram according to the present invention comprises steps of:

providing the above type (i) or type (ii) volume type hologram recording photosensitive composition described above;

applying the volume type hologram recording photosensitive composition to a transparent substrate to form a coating layer; and performing at least, an interference exposure process of exposing the coating layer to interference light, a refractive index modulation promoting process of heating for promoting the modulation of refractive index and a heat-curing process of heating for heat-curing.

The heating in the modulation promoting process in the method of producing a volume type hologram according to the present invention is carried out to more increase the modulation of refractive index by promoting the transfer of a photopolymerizable compound. Particularly when a binder resin which is a factor of inhibiting the transfer of a photopolymerizable compound is contained in the composition as in the case of the type (ii) volume type hologram recording photosensitive composition, the photopolymerizable compound can be transferred actively by heating to a temperature close to the glass transition temperature of the binder resin in the heating in the heat modulation promoting process. Therefore, the amount Δn of modulation of the refractive index in the coating layer is increased to thereby form a bright volume type hologram. Since the volume type hologram according to the present invention is formed using the composition containing the heat-curable compound and the heat-curing crosslinking agent, it has high heat resistance. The heating temperature in the heat-curing process in the production of the volume type hologram of the present invention is preferably 60° C. or more, more preferably 80° C. or more, still more preferably 100° C. or more and most preferably 120 to 200° C. When the heating temperature is kept for a predetermined time, the blocking agent is dissociated from the latent heat-curing crosslinking agent, so that the heat-curing crosslinking agent becomes active to promote the heat-curing of the heat-curable compound.

In the volume type hologram recording photosensitive composition of the present invention, it is desirable to make the refractive index of the photopolymerizable compound differ from that of the heat-curable compound, and desirable to increase a difference in refractive index as larger as possible with the view of increasing the amount Δn of modulation of refractive index to thereby form a bright volume type hologram.

As the latent heat-curing crosslinking agent which may be used for the volume type hologram recording photosensitive composition of the present invention, for example, a blocked carboxylic acid compound obtained by blocking a compound having two or more carboxyl groups with a vinyl ether compound represented by the following formula.

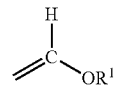

wherein $R^1$ represents alkyl.

Also, examples of materials used as other latent heat-curing crosslinking agents may include blocked isocyanates.

The volume type hologram recording photosensitive composition of the present invention desirably further contains a photopolymerizable initiator and a sensitizing dye.

DESCRIPTION OF THE PREFERRED EMBODIMENT (Photopolymerizable Compound)

The photopolymerizable compound means a compound which can be photo-polymerized by exposure to light. Given as examples of the photopolymerizable compound are photo-radical polymerizable compounds and photo-cationic polymerizable compounds.

i) Photo-radical Polymerizable Compound

As the photo-radical polymerizable compound, compounds having at least one addition-polymerizable ethylenic unsaturated double bond are exemplified. Examples of these compounds include unsaturated carboxylic acids and their salts, esters of unsaturated carboxylic acids and aliphatic polyhydric alcohol compounds and amide compounds of unsaturated carboxylic acids and aliphatic polyvalent amine compounds.

As specific examples, photo-radical polymerizable compounds of the esters of aliphatic polyhydric alcohol compounds and unsaturated carboxylic acids will be given hereinbelow.

Examples of the photo-radical polymerizable compound as acrylates include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropanetriacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyesteracrylate oligomers, 2-phenoxyethylacrylate, 2-phenoxyethylmethacrylate, phenolethoxylate monoacrylate, 2-(p-chlorophenoxy)ethylacrylate, p-chlorophenylacrylate, phenylacrylate, 2-phenylethylacrylate, (2-acryloxyethyl)ether of bisphenol A, ethoxylated bisphenol A diacrylate, 2-(1-naphthyloxy)ethylacrylate, o-biphenylmethacrylate and o-biphenylacrylate.

Also, examples of the above photo-radical polymerizable compound as methacrylates include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis-[p-(3-methacryloxy-2-hydroxy propoxy)phenyl] dimethylmethane, bis-[p-(acryloxyethoxy) phenyl]dimethylmethane, 2,2-bis-(4-methacryloyloxyphenyl) propane and methacrylic acid-2-naphthyl.

ii) Photo-cationic Polymerizable Compound

The photo-cationic polymerization means a reaction for polymerizing the photo-cationic polymerizable compound by an acid generated as a result of the decomposition of the photo-cationic polymerization initiator contained in the composition which decomposition is caused by exposure. As the photo-cationic polymerizable compound used in the photo-cationic polymerization, cyclic ethers represented by an epoxy ring and oxetane ring, thio ethers and vinyl ethers are exemplified. More specific examples of the photo-cationic polymerizable compound include: epoxy ring-containing compounds such as polyalkylene glycol diglycidyl ether, bisphenol A diglycidyl ether, glycerol triglycidyl ether, diglycerol triglycidyl ether, diglycidyl hexahydrophthalate, trimethylolpropane diglycidyl ether, allyl glycidyl ether, phenyl glycidyl ether cyclohexene oxide or the like; and oxetane ring-containing compounds such as 3-ethyl-3-[(2-ethylhexyloxy)methyl] oxetane, bis{[1-ethyl(3-oxetanyl)]methyl} ether or the like.

In the volume type hologram recording photosensitive composition of the present invention, it is desirable to use a photopolymerizable compound having a refractive index as high as possible or as low as possible in order to increase a difference in refractive index between the photopolymerizable compound and the heat-curable compound.

As the photopolymerizable compound having a refractive index of 1.55 or more in particular, those having an aromatic ring and those brominated or chlorinated are exemplified. Examples of these photopolymerizable compounds include phenolethoxylate monoacrylate, 2-(p-chlorophenoxy)ethylacrylate, o-biphenylacrylate, vinylnaphthalene, 2-vinylthiophene, diallyl phthalate, naphthylmethacrylate, N-vinylcarbazole, bis(4-methacryloylthiophenyl)sulfide, p-bromophenylmethacrylate, 2,3-dibromopropylmethacrylate, o-chlorostyrene, pentachlorophenylmethacrylate and pentabromophenylmethacrylate.

Examples of the photopolymerizable compound having a refractive index of 1.49 or less in particular include: aliphatic photopolymerizable compounds such as polyethylene glycol monoacrylate, polyethylene glycol diacrylate, polyethylene glycol dimethacrylate, trimethylolpropane triacrylate, trimethylolpropane trimethacrylate, hexanediol diacrylate and pentaerythritol tetraacrylate or the like; and fluorine-containing photopolymerizable compounds such as 1H,1H,2H,2H-heptadecafluorodecylmethacrylate, 1H,1H,5H-octafluoropentylmethacrylate, 2-(perfluoro-3-methylbutyl)ethylmethacrylate, 2-(perfluorodecyl)ethylmethacrylate, 3-(1H,1H,9H-hexadecafluorononyloxy)-1,2-epoxypropane and 1,4-bis(2', 3'-epoxypropyl)-perfluoro-n-butane or the like.

Oligomers or polymers of the above exemplified compounds may be used.

(Heat-Curable Compound)

As the heat-curable compound, any one of compounds having a heat-curable functional group may be selected and used in a proper combination with the latent heat-curing crosslinking agent which will be explained later. Phenol type compounds, epoxy type compounds, isocyanate type compounds and amide type compounds may be given as typical examples of the heat-curable compound.

Also, it is preferable to use, as the heat-curable compound, compounds differing largely in refractive index from the aforementioned photopolymerizable compound, to increase the modulation of refractive index.

(Latent Heat-Curing Crosslinking Agent)

In the present invention, the latent heat-curing crosslinking agent means a heat-curing crosslinking agent which reacts neither in the interference exposure process nor at a heating temperature used in the refractive index modulation promoting process and is made to be active at a heating temperature used in the heat-curing process. Given as examples of the latent heat-curing crosslinking agent include blocked polycarboxylic acid compounds and blocked polyisocyanate compounds.

As a so-called blocked carboxylic acid compound obtained by blocking a carboxyl group of a carboxylic acid compound, those in which a carboxyl group is blocked with vinyl ethers are put on the market (e.g., products available from NOF CORPORATION). A carboxylic acid compound is one of heat-curable compounds and has the problem that it is little dissolvable and highly reactive. In contrast, if the carboxylic group is blocked, the carboxylic acid has the advantage that it does not enter into a curing reaction at ambient temperature and is chemically stabilized. Many heat-curing crosslinking agents in which a carboxyl group or an isocyanate group is blocked take a liquid state though the compound before blocked is in a solid state. In the case where the latent heat-curing crosslinking agent is in a liquid state in interference exposure at the time of hologram recording, this has the advantage that a lubricating effect is produced and the photopolymerizable compound as a refractive index modulation component is diffused promptly with the result that it is possible to obtain a large difference in refractive index in the resulting hologram.

As a carboxylic acid compound usable to produce the carboxylic acid compound blocked with a vinyl ether compound and used in the present invention, there may be exemplified: unsaturated carboxylic acids such as acrylic acid, methacrylic acid, maleic acid, fumaric acid, itaconic acid or the like; aromatic carboxylic acids such as terephthalic acid, isophthalic acid, 1,3,5-trimesic acid, 1,2,4-trimellitic acid, 2,6-naphthalenedicarboxylic acid, pyromellitic acid or the like; aliphatic carboxylic acids such as succinic acid, adipic acid, 1,2,3,4-butanetetracarboxylic acid or the like; and oligomers or polymers of these compounds.

As a blocking agent used to block a carboxyl group of these carboxylic acid compounds, there may be exemplified vinyl ether compounds, which include alkyl vinyl ethers such as ethyl vinyl ether, n-propyl vinyl ether, isopropyl vinyl ether and n-butyl vinyl ether.

These blocked carboxylic acid compounds become liquid state by blocking even if they are little dissolvable solid state before blocking, there by improving solubility. A Table 1 described below shows regarding some blocked carboxylic acids, their properties before and after blocking with n-propyl vinyl ether and temperature causing dissociation of the blocking agent(reproducing of the heat-curing crosslinking agent from the latent heat-curing crosslinking agent).

TABLE 1

(excerpted from "Nippon Kagaku Kaishi", No. 12, p. 831–840 (2000))

| Kind of Carboxylic acid | Property before Blocking | Property after Blocking | Dissociation Temperature (° C.) |
|---|---|---|---|
| Isophthalic acid | White solid | Transparent liquid | 157 |
| 1,2,4-Trimellitic acid | White solid | Transparent liquid | 134 |
| Pyromellitic acid | White solid | Transparent liquid | 117 |
| Adipic acid | White solid | Transparent liquid | 165 |
| Maleic acid | White solid | Transparent liquid | 136 |
| Itaconic acid | White solid | Thin yellow liquid | 151 |

As isocyanate compounds used to produce the blocked isocyanate compound used in the present invention, tolylenediisocyanate and hexamethylenediisocyanate are exemplified. As a blocking agent for blocking these isocyanate compounds, there may be exemplified compounds containing active hydrogen such as alcohols, lactams, oximes and active methylenes. As commercially available blocked isocyanate, there may be exemplified Collonate 2503, Collonate 2507, Collonate AP Stable and Millionate MS-50 (trademark, available from Nippon Polyurethane Industry Co., Ltd. respectively), Desmodule CT Stable (trademark, available from Sumitomo Bayer Urethane Co., Ltd.) or the like.

When these blocked heat-curing crosslinking agents are heated at a temperature falling in the above range, the blocking agent is dissociated and becomes active. The activity is exhibited by heating them, for example, at 120 to 200° C. for 5 to 60 minutes.

For a curing reaction, there are combinations of a carboxyl group with an amino group, hydroxyl group, epoxy group, oxetanyl group, oxazoline, cyclocarbonate, metal alkoxide or the like, and combinations of an isocyanate group with an amino group, hydroxyl group, epoxy group, oxetanyl group or the like. Any compound having the above carboxyl group, hydroxyl group, epoxy group, oxetanyl group, isocyanate group or the like may be used as the heat-curable compound taking the combination into consideration.

In a case where the blocked carboxylic acid is used as the latent heat-curing crosslinking agent, various ones described above can be exemplified as the functional groups which can form a crosslinked product through a reaction with a carboxylic acid reproduced by dissociation of the blocking agent. Among those combination, a mechanism in crosslinking of the carboxyl group with epoxy group which is a representative crosslinking system is described in, for example, "Sikizai" vol.67(12), p.766–774(1994), "Sikizai" vol.69(11), p.736–742(1996), "Nippon Kagaku Kaishi" No.12, p.831–840(2000) or the like.

That is, the crosslinking reaction of vinyl ether-blocked carboxyl group with epoxy group is explained as a successive reaction including reactions (1)–(3), as expressed by the following chemical formulas: (1) reproduction of the carboxyl group by dissociation of the blocking agent; (2) esterification of the dissociated carboxyl group with the epoxy group; and (3) a reaction in which the hydroxyl group in the ester formed by the above reaction (2) is addition-reacted with the dissociated vinyl ether. The vinyl ether group generated by dissociation reacts with the hydroxyl group in the ester compound formed in the reaction (2) by the addition reaction, and thus there is no fear that the vinyl ether group in a free(liberation) form is present in a cured layer and deteriorate properties of the layer.

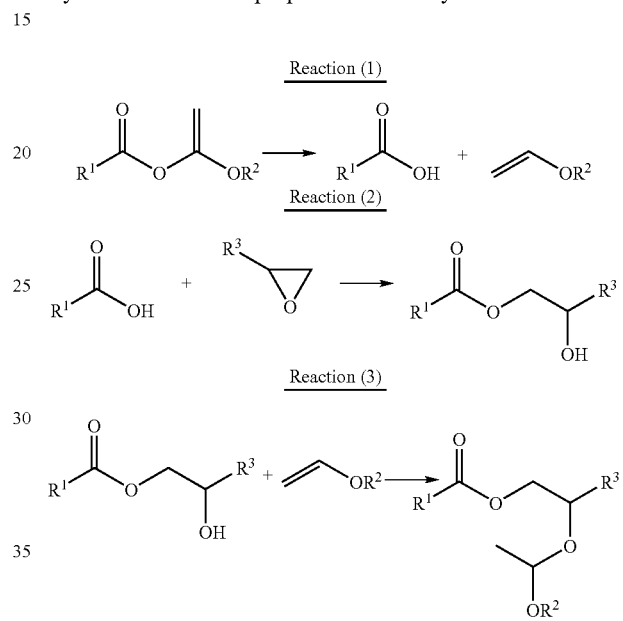

(Excerpted from Nippon Kagaku Kaishi, No. 12, p. 831–840 (2000))

Though it is presumed that the crosslinking reaction effected by the carboxyl group and the epoxy group further includes polymerization between epoxy groups or the like, addition of a weak Lewis acid as a catalyst in the composition can promote dissociation of the blocked carboxylic acid and esterification of the carboxylic acid with the epoxy compound. As the weak Lewis acid, zinc 2-ethylhexanoate may be exemplified.

These reactions can be detected by the IR measurement or the like. The dissociation process can be detected by measuring change of absorption based on the carboxyl group (for example, 3500 $cm^{-1}$ (—OH)) to be reproduced by dissociation. Further, the esterification of the carboxyl group with the epoxy group can be detected by measuring decrease of absorption based on the epoxy group (for example, 910 $cm^{-1}$) or by measuring change of absorption based on the hydroxyl group (for example, 3500 $cm^{-1}$) to be generated. Further, addition reaction to the hydroxyl group of the vinyl ether generated by dissociation can also be detected by measuring decrease of absorption based on the hydroxyl group.

(Binder Resin)

A binder resin maybe added for the purpose of improving the film strength (layer strength) of the resulting volume type hologram.

As the binder resin, polymethacrylates or their partially hydrolyzed products, polyvinyl acetates or their hydrolyzates, polyvinyl alcohols or those obtained by converting these alcohols partly into acetal compounds, triacetyl cellulose, polyisoprene, polybutadiene, polychloroprene, silicone rubber, polystyrene, polyvinylbutyral, polychloroprene, polyvinyl chloride, chlorinated polyethylene, chlorinated polypropylene, poly-N-vinylcarbazole or its derivatives, poly-N-vinylpyrrolidone or its derivatives, copolymers of styrene and maleic acid anhydride or their half-esters may be used.

Compounds which contain, as their major skeletons, a homo- or co-polymer constituted of at least one copolymerizable compound such as a monomer, as a polymerization component, selected from the group consisting of acrylic acid, acrylates, methacrylic acid, methacrylates, acrylamide, acrylonitrile, ethylene, propylene, vinyl chloride and vinyl acetate and in which a heat-curable functional group is introduced into the principal chain or side chain may also be used.

When a binder resin into which a heat-curable functional group is introduced is used, a closer network is formed by a crosslinking reaction between the binder resin and the heat-curable compound, whereby a hologram with excellent mechanical characteristics of the layer and high heat resistance can be obtained.

A binder resin in which the heat-curable crosslinking group (i.e., the heat-curable crosslinking agent) in a blocked state is introduced into a principal chain or a side chain of the binder resin can also be used. In this case similarly, the network becomes closer by crosslinking reaction between the binder resin and the heat-curable compound, whereby a hologram with excellent mechanical characteristics of the layer and high heat resistance can be obtained.

As the binder resin, so-called oligomers having a number average molecular weight of about 1000 to 10000 may also be used. The transfer of the photopolymerizable compound such as a monomer which is a refractive index modulating component is activated by the use of an oligomer having such a molecular weight so that the photopolymerizable compound is separated clearly during exposure, whereby a large difference in refractive index can be obtained in a volume type hologram obtained finally.

(Photopolymerization Initiator)

Next, the photopolymerization initiator will be explained. As the photopolymerization initiator, a photo-radical polymerization initiator or a photo-cationic polymerization initiator may be used.

Examples of the photo-radical polymerization initiator include imidazole derivatives, bisimidazole derivatives, N-aryl glycine derivatives, organic azide compounds, titanocene, aluminate complex, organic peroxide, N-alkoxyl pyridinium salt, thioxanthone derivatives or the like. More specifically, there may be exemplified 1,3-di(t-butyldioxycarbonyl)benzophenone, 3,3',4,4'-tetrakis(t-butyldioxycarbonyl)benzophenone, 3-phenyl-5-isoxazolone, 2-mercaptobenzimidazole, bis(2,4,5-triphenyl)imidazole, 2,2'-dimethoxy-1,2-diphenylethane-1-on (trade name: Irgacure 651, Ciba Specialty Chemicals Co., Ltd.), 1-hydroxy-cyclohexyl-phenyl-ketone (trade name: Irgacure 184, Ciba Specialty Chemicals Co., Ltd.), 2-benzyl-2-dimethylamino-1-(4-morpholinophenyl)-butane-1-on (trade name: Irgacure 369, Ciba Specialty Chemicals Co., Ltd.), bis($\eta^5$-2,4-cyclopentadien-1-yl)-bis(2,6-difluoro-3-(1H-pyrrole-1-yl)-phenyl)titanium (tradename: Irgacure784, Ciba Specialty Chemicals Co., Ltd.) or the like, but it is not limited to them.

Examples of the photo-cationic polymerization initiator include sulfonic acid ester, imido sulfonate, dialkyl-4-hydroxylsuifonium salt, arylsulfonic acid-p-nitrobenzyl ester, silanol-aluminum complexes, ($\eta^6$-benzene)($\eta^5$-cyclopentadienyl)iron (II) or the like. More specifically, there maybe exemplified benzointosylate, 2,5-dinitrobenzyltosylate, N-tosylphthalic acid imide or the like, but it is not limited to them.

Examples of that usable as both the photo-radical polymerization initiator and the photo-cationic polymerization initiator include aromatic iodonium salts, aromatic sulfonium salts, aromatic diazonium salts, aromatic phosphonium salts, triazine compounds, iron-arene complex or the like. More specifically, there may be exemplified: chloride, bromide and borofluoride salts of iodonium such as diphenyl iodonium, ditolyl iodonium, bis(p-tert-butylphenyl)iodonium, and bis(p-chlorophenyl) iodonium; iodonium salts of hexafluorophosphate and hexafluoroantimonate; chloride, bromide and borofluoride salt of sulfonium such as triphenyl sulfonium, 4-tert-butyltriphenyl sulfonium and tris(4-methylphenyl) sulfonium; sulfonium salts of hexafluorophosphate and hexafluoroantimonate; 2,4,6-substituted-1,3,5-triazine compounds such as 2,4,6-tris(trichloromethyl)-1,3,5-triazine, 2-phenyl-4,6-bis(trichloromethyl)-1,3,5-triazine, 2-methyl-4,6-bis (trichloromethyl)-1,3,5-triazine; or the like, but it is not limited to them.

The photopolymerization initiator is preferably treated by decomposition after hologram recording from the viewpoint of the stability of a recorded hologram.

(Sensitizing Dye)

A sensitizing dye may be added for the purpose of improving sensitivity to the wavelength of laser light used for recording a hologram. Examples of such a sensitizing dye include a thiopyrylium salt type dyes, merocyanine type dyes, quinoline type dyes, styrylquinoline type dyes, coumarin type dyes, ketocoumarin type dyes, thioxanthene type dyes, xanthene type dyes, oxonol type dyes, cyanine type dyes, rhodamine type dyes and pyrylium salt type dyes.

More specifically, there may be exemplified: cyanine or merocyanine type dyes such as 3,3'-dicarboxylethyl-2,2'-thiocyanine bromide, 1-carboxylmethyl-1'-carboxylethyl-2, 2'-quinocyanine bromide, 1,3'-diethyl-2,2'-quinothiacyanine iodide, 3-ethyl-5-[(3-ethyl-2-(3H)-benzothiazorilidene)ethylidene]-2-thioxo-4-oxazolidine; coumarin or ketocoumarin type dyes such as 3-(2'-benzimidazole)-7-N,N-diethylaminocoumarin, 3,3'-carbonyl bis (7-diethylaminocoumarin), 3,3'-carbonyl bis(7-acetoxycoumarin); or the like, but it is not limited to them.

Visible-light sensitizing dyes are preferably those which become non-colored by decomposition or the like caused by heating or ultraviolet radiation in the process successive to the recording of a hologram in the case requiring high transparency such as optical elements.

(Compounding Ratio)

(i) In the Case of Containing No Binder Resin

The heat-curable compound is used in a proportion of preferably 10 to 1000 parts by weight and more preferably 10 to 100 parts by weight based on 100 parts by weight of the photopolymerizable compound. The latent heat-curing crosslinking agent is compounded in an appropriate amount calculated in consideration of the amount of the heat-curable compound to be compounded. The photopolymerization initiator is used in an amount of preferably 1 to 10 parts by weight and more preferably 5 to 10 parts by weight based on 100 parts by weight of the photopolymerizable compound. The sensitizing dye is used in an amount of preferably 0.01 to 1 part by weight and more preferably 0.01 to 0.5 parts by weight based on 100 parts by weight of the photo polymerizable compound.

(ii) In the Case of Containing a Binder Resin

The photopolymerizable compound is used in an amount of preferably 10 to 1000 parts by weight and more preferably 10 to 100 parts by weight based on 100 parts by weight of the binder resin.

The heat-curable compound is used in an amount of preferably 10 to 1000 parts by weight and more preferably 10 to 100 parts by weight based on 100 parts by weight of the binder resin.

The latent heat-curing crosslinking agent is compounded in an appropriate amount calculated in consideration of the amount of the heat-curable compound to be compounded.

The photopolymerization initiator is used in an amount of preferably 1 to 10 parts by weight and more preferably 5 to 10 parts by weight based on 100 parts by weight of the binder resin.

The sensitizing dye is used in an amount of preferably 0.01 to 1 part by weight and more preferably 0.01 to 0.5 parts by weight based on 100 parts by weight of the binder resin.

(Solvent)

The aforementioned volume type hologram recording photosensitive composition may be dissolved in solvent such as acetone, methyl ethyl ketone, methyl isobutyl ketone, cyclohexanone, benzene, toluene, xylene, chlorobenzene, tetrahydrofuran, methyl cellosolve, ethyl cellosolve, methyl cellosolve acetate, ethyl cellosolve acetate, ethyl acetate, 1,4-dioxane, 1,2-dichloroethane, dichloromethane, chloroform, methanol, ethanol, isopropanol or the like or mixed solvents of these solvents. The resulting solution is used as a coating liquid.

(Substrate Film)

Examples of the substrate film used in the volume type hologram recording photosensitive medium include resin films having transparency, such as a polyethylene film, polypropylene film, polyethylene fluoride type film, polyvinylidene fluoride film, polyvinyl chloride film, polyvinylidene chloride film, ethylene-vinyl alcohol film, polyvinyl alcohol film, polymethylmethacrylate film, polyether sulfone film, polyether ether ketone film, polyamide film, tetrafluoroethylene-perfluoroalkylvinyl ether copolymer film, polyester film such as polyethylene terephthalate film and polyimide film. The thickness of the film is usually 2 to 200 μm and preferably 10 to 50 μm.

(Formation of a coating Layer)

The aforementioned coating liquid is applied to the above substrate by a method using, for example, a spin coater, gravure coater, comma coater or bar coater, followed by drying to obtain the volume type hologram recording photosensitive medium of the present invention. When the viscosity of the coating liquid is low and particularly a binder resin is not used such as the type (i), it is desirable to form the coating layer of the volume type hologram recording photosensitive medium by sandwiching the coating liquid between glass plates in such a form as to seal the periphery.

The thickness of the volume type hologram recording photosensitive material layer is usually 1 to 100 μm and preferably 10 to 40 μm. Also, when the volume type hologram recording photosensitive material layer after dried has tackiness, a film exemplified as the above substrate film may be laminated as a protective film. In this case, the surface of the laminate film which surface is in contact with the volume type hologram recording photosensitive material layer may be processed by releasing treatment so that the laminate film is easily peeled off.

(Light Used to Record a Hologram)

As the light used to record a hologram, excellently coherent (interferential ability) visible laser light from, for example, an argon ion laser (458 nm, 488 nm and 514.5 nm), krypton ion laser (647.1 nm) and YAG laser (532 nm) is used.

(Recording of a Hologram)

As a system of recording a hologram, for example, the following three systems are exemplified:

1. Contact exposure system, in which the coating layer of the volume type hologram recording photosensitive composition is made to be in contact with an original plate to apply laser light from the coating layer side, thereby recording by the interference between the laser light reflected from the original plate and the incident laser light;

2. Contact exposure system, in which a medium is brought into contact with an original plate through an index matching liquid in the case where the medium is sandwiched between glasses or films, and light is made to be incident from the medium side, thereby recording by the interference between the laser light reflected from the original plate and the incident laser light; and 3. System in which laser light is divided in two directions and one light is directly incident to the coating layer of the volume type hologram recording photosensitive composition and another is incident to an object to be recorded, thereby recording by the interference between the light reflected from the object and the direct incident light.

(Mechanism for Formation of Volume Type Hologram and Characteristics of Volume Type Hologram)

The mechanism for recording the volume type hologram of the volume type hologram recording photosensitive composition in the present invention is explained as follows. Specifically, when the photosensitive composition formed as a film or a layer is exposed to interferential light by means of the laser, photopolymerization is initiated at bright regions irradiated with more intense light. Along with the polymerization, a gradient of concentration of the photopolymerizable compound is produced, which causes the photopolymerizable compound to diffuse and move from dark regions irradiated with weak light to the bright regions irradiated with intense light. As a consequence, a difference in the concentration of the photopolymerizable compound is caused corresponding to the light intensities of the interference light and appears as a difference in refractive index. In the dark regions irradiated with weak light, the concentration of the heat-curable compound and the latent heat-curing crosslinking agent which are non-reactive to the light is increased.

At this time, the modulation of refractive index can be made larger by using a compound with a low refractive index as the photopolymerizable compound and a compound with a high refractive index such that as having an aromatic ring or the like as the blocked heat-curable compound.

Since the present invention is provided with the refractive index modulation promoting process of heating to promote the modulation of refractive index, the transfer of a photopolymerizable compound is promoted. In the type (ii) volume type hologram recording photosensitive composition in particular, the binder resin is heated to a temperature close to its glass transition temperature and therefore the transfer of a photopolymerizable compound is promoted, so that the modulation of refractive index is increased whereby a bright image hologram can be obtained.

Moreover, in the present invention, the latent heat-curing crosslinking agent which does not react at the heating temperature used in the refractive index modulation promoting process and is made active at the heating temperature used in the heat-curing process is used. Therefore, no heat-curing reaction is run in the refractive index modulation promoting process and the refractive index modulation promoting process can be performed stably. Next, since the present invention is provided with the heat-curing process of heat-curing a coating layer, the resulting coating layer has high heat resistance.

When performing this heat-curing process, the heating process for increasing the modulation of refractive index and the heating process for heat-curing a coating layer may be carried out at the same time. Also, in the present invention, whole surface exposure to ultraviolet rays may be carried out optionally after the interference exposure.

EXAMPLES

Example 1

The components as shown below were compounded to produce a volume type hologram recording photosensitive composition solution.

| <Composition solution> | |
|---|---|
| Ethylacrylate/hydroxylethylmethacrylate copolymer (100/60) (as a binder resin) | 100 parts by weight |
| Polyethylene glycol diacrylate (as a photopolymerizable compound) | 80 parts by weight |
| Bisphenol A type diglycidyl ether (as a heat-curable compound) | 80 parts by weight |
| Blocked carboxylic acid (one obtained by blocking a carboxyl group of 1,2,4-trimellitic acid with ethyl vinyl ether) (as a latent heat-curing crosslinking agent) | 30 parts by weight |
| Irgacure 784 (available from Chiba Speciality Chemicals Co., Ltd.) (as a photopolymerization initiator) | 5 parts by weight |
| Toluene | 30 parts by weight |
| Methyl ethyl ketone | 30 parts by weight |

The above solution was applied to a polyethylene terephthalate (PET) film (Lumirror T-60, available from Toray Industries Inc.) 38 μm in thickness by means of a bar coater to form a photosensitive layer with thickness of 20 μm in dried state, thereby producing a volume type hologram recording photosensitive medium.

The photosensitive layer side of the photosensitive medium was laminated with a mirror and 514.5 nm argon ion laser light is made to be incident from the PET side to record a volume type hologram.

Next, as a process for increasing the modulation of refractive index, the medium was heated at 100° C. for 30 minutes and further at 150° C. for 30 minutes for heat-curing to obtain a fixed volume type hologram.

The obtained hologram was evaluated spectrally and Δn calculated from the result of the evaluation was 0.027. Also, the heat resistance was evaluated by measuring dynamic viscoelasticity and as a result, the glass transition temperature was about 130° C.

Comparative Example 1

(Example Using a Curing Agent Which is Not Latent)

A volume type hologram was manufactured in the same manner as in Example 1 except that 1,2,4-trimellitic acid was used as a heat-curing crosslinking agent which was not latent in place of the latent heat-curing crosslinking agent in the composition of the volume type hologram recording photosensitive composition solution of Example 1.

As a result, Δn of the resulting volume type hologram was 0.009 and only insufficient hologram performance could be obtained. It is presumed that a heat-curing reaction took place at the time of heating at 100° C. for 30 minutes in the refractive index modulation promoting process, so that the transfer of a photopolymerizable compound is inhibited.

When comparing the storage stability of the solution of Example 1 with that of the solution of Comparative Example 1 in the storage condition of 50° C., no change was observed in the solution of Example 1 where as the solution of Comparative Example 1 was gelled in about one week and became unusable.

As mentioned above, the volume type hologram produced using the volume type hologram recording photosensitive composition of the present invention has a high Δn capable of exhibiting excellent optical characteristics and exhibits high heat resistance.

The volume type hologram recording photosensitive composition of the present invention contains a latent heat-curing crosslinking agent, which becomes active under a specific heating condition. The latent heat-curing crosslinking agent has the characteristics that it is reacted neither in the interference exposure process nor by heating in the refractive index modulation promoting process and serves to cure a coating layer when heated finally at temperatures at which the blocked positions are broken. Such characteristics ensure that a photopolymerizable compound is transferred actively by heating to a temperature close to the glass transition temperature of the binder resin in the refractive index modulation promoting process to increase the amount Δn of the modulation of refractive index in the coating layer, whereby a bright hologram can be formed.

The volume type hologram of the present invention is formed of a composition containing a heat-curable compound and a heat-curing crosslinking agent and therefore the heat resistance can be improved.

What is claimed is:

1. A volume type hologram recording photosensitive composition comprising one or more photopolymerizable compounds, a heat-curable compound and a heat-curing crosslinking agent, wherein the heat-curing crosslinking agent is a blocked carboxylic acid compound obtained by blocking a compound having two or more carboxyl groups with a vinyl ether compound represented by the following formula:

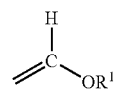

wherein $R^1$ represents alkyl,
and the blocked carboxylic acid compound is a latent heat-curing crosslinking agent which is not reacted in an interference exposure process, is not reacted at a heating temperature used in a refractive index modulation promoting process and becomes active at a heating temperature used in a heat-curing process.

2. A volume type hologram recording photosensitive composition according to claim 1, wherein the composition further comprises a binder resin.

3. A volume type hologram recording photosensitive composition according to claim 2, wherein a heat-curable functional group is introduced into the binder resin.

4. A volume type hologram recording photosensitive composition according to claim 2, wherein the blocked heat-curing crosslinking agent is introduced into the binder resin.

5. A volume type hologram recording photosensitive composition according to claim 1, wherein the heating temperature in the heat-curing process is 60° C. or more.

6. A volume type hologram recording photosensitive composition according to claim 1, wherein the refractive index of the photopolymerizable compound is different from that of the heat-curable compound.

7. A volume type hologram recording photosensitive compositions according to claim 1, wherein the composition further comprise a photopolymerization initiator.

8. A volume type hologram recording photosensitive composition according to claim 1, the composition further comprises a sensitizing dye.

9. A volume type hologram recording photosensitive recording medium provided with a layer of a volume type hologram recording photosensitive composition on a transparent film substrate, wherein the volume type hologram recording photosensitive composition comprises one or more photopolymerizable compounds, a heat-curable compound and a heat-curing crosslinking agent, the heat-curing crosslinking agent being a blocked carboxylic acid compound obtained by blocking a compound having two or more carboxyl groups with a vinyl ether compound represented by the following formula:

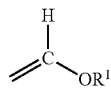

wherein $R^1$ represents alkyl,
and, the blocked carboxylic acid compound being a latent heat-curing crosslinking agent which is not reacted in an Interference exposure process, is not reacted at a heating temperature used in a refractive index modulation promoting process and becomes active at a heating temperature used in a heat-curing process.

10. A volume type hologram recording photosensitive recording medium according to claim 9, wherein the volume type hologram recording photosensitive composition further comprises a binder resin.

11. A method of producing a volume type hologram, the method comprising steps of:

providing a volume type hologram recording photosensitive composition comprising one or more photopolymerizable compounds, a heat-curable compound and a heat-curing crosslinking agent, the heat-curing crosslinking agent being a latent heat-curing crosslinking agent which is not reacted in an interference exposure process, is not reacted at a heating temperature used in a refractive index modulation promoting process and becomes active at a heating temperature used in a heat-curing process;

applying the volume type hologram recording photosensitive composition to a transparent substrate to form a coating layer;

and performing at least, an interference exposure process of exposing the coating layer to interference light, a refractive index modulation promoting process of heating the coating layer at a temperature lower than that at which the latent heat-curing crosslinking agent becomes active to promote the modulation of refractive index, and a heat-curing process of heating the coating layer at a temperature not lower than that the latent heat-curing crosslinking agent becomes active to heat-cure the coating layer; and wherein the heat-curing crosslinking agent is a blocked carboxylic acid compound obtained by blocking a compound having two or more carboxyl groups with a vinyl ether compound represented by the following formula:

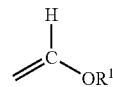

wherein $R^1$ represents alkyl.

12. A method of producing a volume type hologram according to claim 11, wherein the volume type hologram recording photosensitive composition further comprises a binder resin in addition to the photopolymerizable compounds and the heat-curable compound.

* * * * *